United States Patent [19]
Nostwick

[11] Patent Number: 5,675,476
[45] Date of Patent: Oct. 7, 1997

[54] PHASE CONTROLLED BRIDGE

[76] Inventor: Allan A. Nostwick, 4625 N. 615th West, Huntington, Ind. 46750

[21] Appl. No.: 457,394

[22] Filed: Jun. 1, 1995

[51] Int. Cl.$^6$ ............................. H02M 3/335; G05F 1/00
[52] U.S. Cl. ................................................. 363/17; 323/217
[58] Field of Search .......................... 363/17, 98, 132; 323/212, 217, 218

[56] References Cited

U.S. PATENT DOCUMENTS

| | | |
|---|---|---|
| 4,321,508 | 3/1982 | Adler et al. . |
| 4,336,461 | 6/1982 | Ida . |
| 4,388,563 | 6/1983 | Hyltin . |
| 4,388,567 | 6/1983 | Yamazaki et al. . |
| 4,717,994 | 1/1988 | Diaz et al. . |
| 4,857,921 | 8/1989 | McBride et al. . |
| 5,006,724 | 4/1991 | Liu . |
| 5,099,202 | 3/1992 | Claydon et al. . |
| 5,165,049 | 11/1992 | Rotman ................................. 323/212 |
| 5,227,961 | 7/1993 | Claydon et al. . |
| 5,245,520 | 9/1993 | Imbertson . |
| 5,291,384 | 3/1994 | Mammano et al. . |
| 5,349,522 | 9/1994 | Konishi et al. ............................. 363/95 |
| 5,500,791 | 3/1996 | Kheraluwala et al. .................... 363/17 |

*Primary Examiner*—Matthew V. Nguyen
*Attorney, Agent, or Firm*—Harold Levine Esq PC

[57] ABSTRACT

A phase controlled 50 percent duty cycle variable output bridge power converter in which the 50% duty cycle is maintained constant while power output is controlled by changing the phase relationships between two 50 percent duty cycle square waves. When the 50 percent duty cycle square waves are 180 degrees out of phase, the output power is maximum, whereas when the waves are in phase, the output power is essentially zero. The circuits are conditioned to operate in a current mode, snubbing circuits are provided to improve load line characteristics and power consumption of the switching elements, and both soft start-up and controlled shut-down circuits are included to further enhance circuit performance.

45 Claims, 10 Drawing Sheets

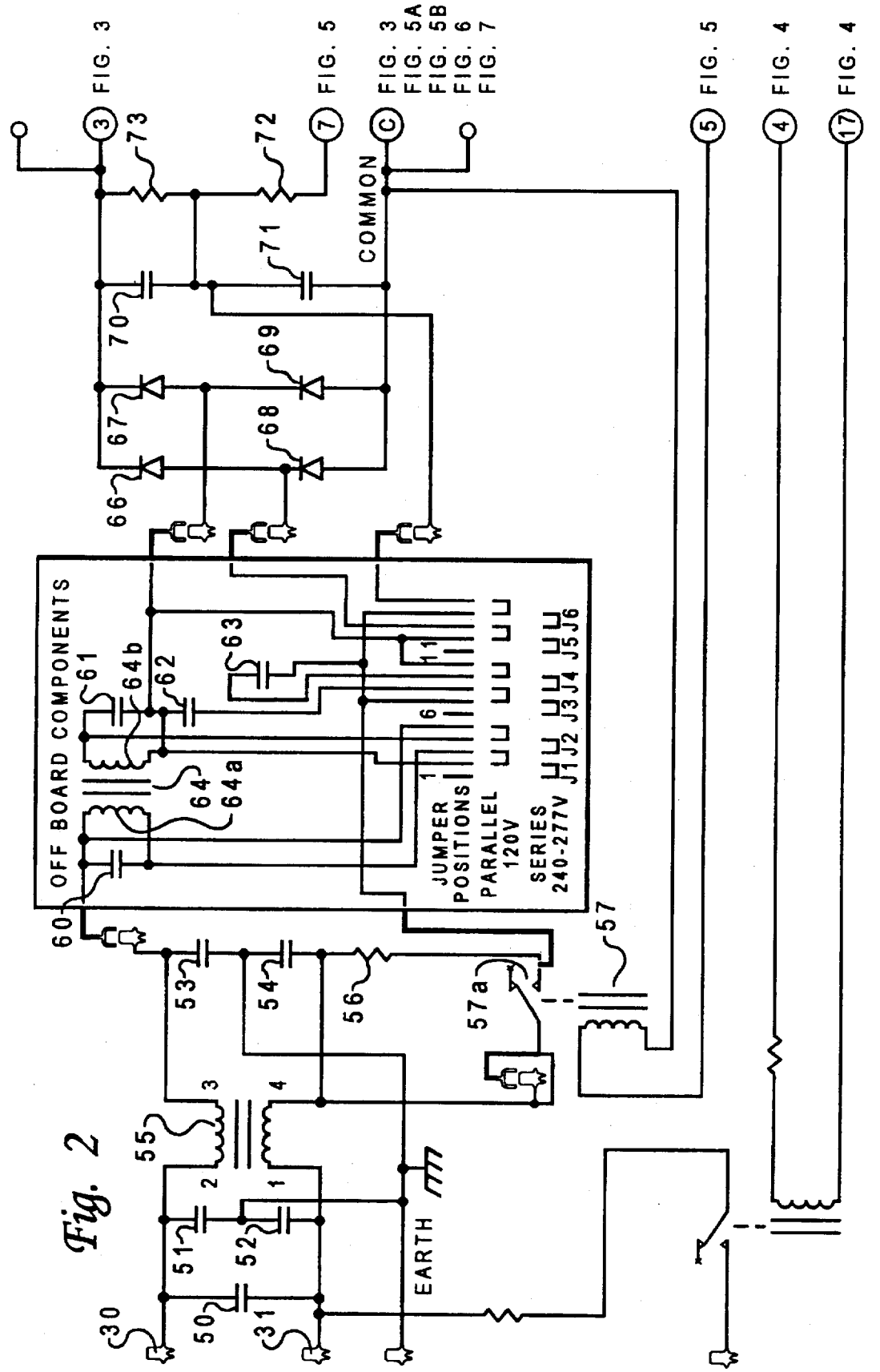

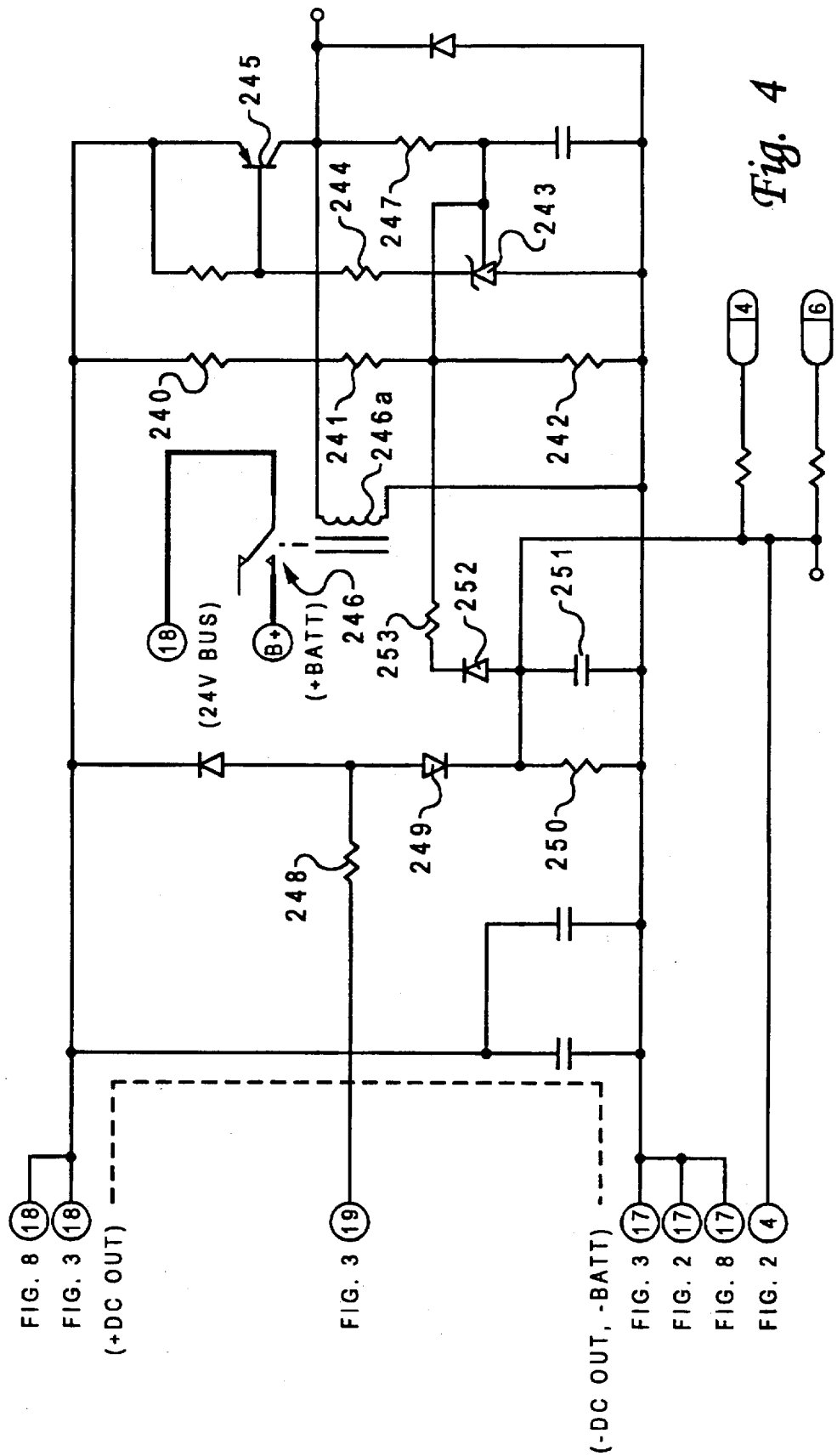

PHASE CONTROLLED BRIDGE

This invention relates to variable output bridge power converter circuits and more particularly to a 50 percent duty cycle phase controlled bridge having current mode control, soft start-up and controlled shut-down circuits and snubbing circuits for control of current-voltage characteristics.

BACKGROUND OF THE INVENTION

Fifty percent duty cycle phase controlled bridge circuits have heretofore been known, illustrative of which are those disclosed in U.S. Pat. Nos. 5,099,202 and 5,227,961 granted to Glenn S. Claydon and William J. Laughton on Mar. 24, 1992 and Jul. 13, 1993 respectively. When in a phase shift-control mode, a phase shift generator receives two input pulse train signals and generates two output pulse train signals, each having a 50% duty cycle, which are phase-shifted in a range from 0 to 180 degrees by an amount proportional to the duty cycle of the input pulse train signals, such phase shift being adjusted in response to the power supply load requirements. However, such circuits tend to exhibit vulnerability to certain factors such as undesired voltage-current characteristics of the output coupling circuits which tend to degrade their performance. Accordingly, there had continued to be a need for such circuits in which voltage-current characteristics of switching element loads and other circuit characteristics, e.g., start-up and shut-down, are further improved and/or optimized.

BRIEF SUMMARY OF THE INVENTION

The improved system according to the invention hereof includes a phase controlled 50 percent duty cycle bridge that operates in a current mode and in cooperative combination with improved snubbing, soft start-up, controlled shut-down and related circuits to ameliorate untoward effects otherwise associated with start-up, shut-down, circuit switching and other dynamic circuit operations.

OBJECTS AND FEATURES OF THE INVENTION

It is one general object of the invention to improve variable output bridge power converter systems.

It is another object of the invention to effectively control undesirable voltage-current relationships in such systems.

It is yet another object of the invention to modularize such systems.

It is still another object of the invention to provide for simple modular jumper connections to change input operating voltage ranges of such systems.

Accordingly, in accordance with one feature of the invention, a plurality of snubbing circuits are interconnected with switching circuits to alter normal loadline (voltage-current) characteristics, thus reducing power loss in the switching elements.

In accordance with another feature of the invention, the principal parts of the circuits operate in a current mode, thus facilitating circuit operation and control.

In accordance with still another feature of the invention, there are provided soft start-up circuits interconnected with the system switching control circuits, thus facilitating smooth and controlled start-up.

In accordance with yet another feature of the invention, there are provided controlled shut-down circuits interconnected with system switching control circuits, thus facilitating controlled shut-down.

In accordance with one further feature of the invention, there are provided a pair of interconnecting filters within the alternating current input circuits to suppress radio frequency interference and to reduce harmonic content of the current waveform with which the circuits load the incoming power mains.

In accordance with still one further feature of the invention, there are provided a set of jumpers mounted on a single moveable jumper bar to facilitate manual configuring of the system to accept different levels of input voltages.

These and other objects and features of the invention will be apparent from the following detailed description, by way of example of a preferred embodiment, with reference to the drawing.

BRIEF DESCRIPTION OF THE DRAWING

FIG. 2 is a schematic diagram illustrating input circuits and the simplicity of changing of jumpers to correspondingly condition the circuits for different ranges of input voltages;

FIG. 4 is a schematic diagram of battery low voltage cut-off circuits;

DESCRIPTION OF A PREFERRED EMBODIMENT

Figure 1A:
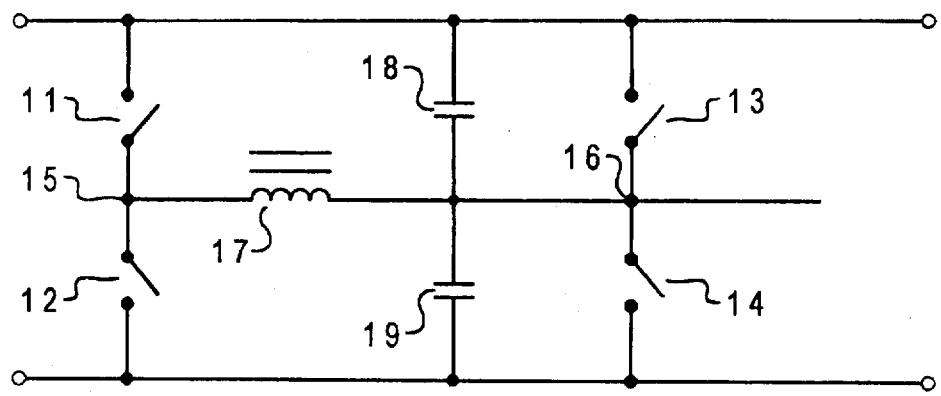
FIG. 1A is a simplified schematic diagram illustrating the principles underlying operation of the circuits.

Before turning to the drawing, reference is made to two copending U.S. patent applications Ser. Nos. 08/456,854 and 08/457,015 filed on even date herewith and assigned to the assignee of this application. The contents of those two companion applications are herein incorporated by reference.

DEFINITIONS

Before proceeding further, it may be helpful to present information relating to certain terms that are hereinafter defined with meanings as employed in this specification and the appended claims:

1. Snubbing means "a combination of circuit components which result in a given load behaving similar to a capacitor at switch turn-off and similar to an inductor at switch turn-on, this being accomplished by modifying the load load-line by changing its otherwise existing voltage-current characteristics at time of switch-on and switch-off."

To help in understanding snubbing, it will be seen that it generally refers to an array of components that modify the shape of an active element (driving device) "load line" so that the load line favors, or places a lesser burden on, the driving device or system that supplies energy to the subsystem which presents the load line under consideration. As will be evident to those skilled in the art, a "load line" is a graphical representation of current versus voltage that represents the load that is seen by the active element. To better visualize a load line, it may be considered that an electrical component having two terminals wherein the impressing of any arbitrary voltage across those terminals will result in a flow of current from one terminal to the other, internally through the component, would in this context be a load. For any specific value of impressed voltage there will be some corresponding value of current. If the component is a simple resistance, the current will be linearly related to the voltage and will not be altered in any way by the length of time for which the voltage exists. If the component is a reactance, inductive or capacitive, the current value will be highly dependent on the length of time the voltage exists, or on the way in which the voltage changes with time. When a simple resistance is connected between a source of continuous voltage and a control device capable of conducting varying amounts of current such that all three elements are effectively in series, the load line then is a straight line plotted on a two dimensional graph relating the voltage across the variably conducting element on one axis to the current passing through the variably conducting element on the other, with one end of the line on the voltage axis at the value of the continuous source voltage, and the other end of the line on the current axis at the value of current that exists when the full source voltage is impressed across the terminals of the load.

Modification of the shape of the load line becomes significant when the load is a reactance and is time dependent. In many power electronics systems, the load will be inductive, having the property of sustaining whatever current is passing through such load at a relatively constant level, even though the voltage is subject to variations. If such an inductive load is switched by a variably conducting device such as a switch from a highly conducting state to a nearly non-conducting state in a relatively short period of time, the tendency of the inductive load to maintain a constant current will cause the voltage across the switch to rise to whatever level the physical limitations will allow before a breakdown occurs. Accordingly, it is common practice to limit the voltage to some definite value by clamp circuits connecting additional circuit components in parallel with the switch to sustain the current that will be provided by the inductive load, the inducting load now acting as an energy source and returning to the circuit energy that had been previously stored in it when the current was flowing. In such instance the clamp circuits limit the induced voltage, and the load then is known as a clamped inductive load. When this occurs, the load line becomes a line from the existing current point on the current axis running parallel to the voltage axis, which is to say having higher and higher voltage while the current is maintained constant, until the voltage level of the clamp is reached, whereupon the current through the switch falls to zero or some very low value while the inductive current continues to be sustained by the clamp. Such a load line tends to be rectangular, with two segments each parallel to one axis of the graph, and with a maximum simultaneous voltage and current point at the corner that represents a high instantaneous value of power that is being dissipated in the switch. It is this high peak power that snubbing is employed to reduce. Not only does such peak power represent a loss of energy that lowers the overall efficiency of the system but also such a peak is particularly destructive to some types of semiconductor switches. Insofar as clamping configurations are concerned, in order that the peak power not be dissipated and therefore lost as heat, it is desirable that the circuits be so arranged that the clamp current is returned to a part of the circuit where the energy it represents can be effectively utilized.

When the load is inductive and the switch is being turned on, it can be seen that the voltage across the switch can fall from the open circuit value to the fully on value (usually very low) without significant current occurring until the switch is fully closed, and the power dissipated in the switch is very small. Thus, an inductor is a very easy load to turn on. A capacitive load, on the other hand, is a very favorable load to turn off since the current will fall to zero in such a load with essentially no change of voltage. It is therefore highly desirable, therefore to have a reactive load behave as a capacitor at time of turn off and an inductor at time of turn on.

Unfortunately, as good as a capacitor is for a load at switch turn-off, it is equally bad as a load at turn on since the capacitor tends to maintain a constant terminal voltage regardless of short term variations in current. Thus, if the switch is off and a low voltage exists across the load at the time of turn on, there will be a very high inrush current through the switch for a short time, a condition that is as undesirable as any of the conditions described above for inductive loads. Accordingly, it will be seen that a capacitor is a good load for turning off but a very bad load for turning on.

As will be evident from the following detailed description, in the instant bridge converter, provision is made for particularly efficacious cooperative combination with snubbing circuits by providing that one leg of the bridge always performs the act of turning on the load, while the other leg always performs the act of turning the load off thus making it possible to provide effective load-line modification by the interconnection of a pair of simple single components namely, one capacitor and one inductor. This is accomplished through inductor 91 and capacitor 92 both shown and described below in connection with FIG. 3.

2. Soft Start-Up means "action of an array of components that modify an otherwise abrupt transition of a system from Off to On. That is, for the instant system, a process whereby the power conversion is caused to transition from a non-running condition to a running condition in a gradual and controlled manner."

There are components within the instant system, notably capacitors, inductors and transformers, that have a time dependent quality; and consequently there is a period of time at start-up before normal steady state values of voltages and currents are established when there occur transient values of voltage or current that may damage circuit components, most notably semiconductor components. Either such components must be chosen to be of such a size that the transient values can be tolerated without damage or means must be employed to reduce such transients to values that will be tolerated by components that are more preferable to use.

The phase shift controlled inverter according to the invention includes four Gate drive signals that must all be properly generated before operation full power can be achieved. The point at which start-up control is applied is the output of an error amplifier in the current mode controller IC501 described in detail below. A bipolar transistor is employed in a Miller integrator circuit to hold down and then allow the controlled rise of the voltage on the output, and start-up occurs on the basis of the internal supply voltage called Vcc reaching its normal regulated value.

3. Controlled Shut Down means "action of an array of components that modify an otherwise abrupt transition of a system from On to Off. That is, for the instant system, a process whereby the power conversion is caused to transition from a running condition to a non-running condition in a gradual and controlled manner."

It has been found that potentially damaging transients could occur if the above-mentioned gate drives are suddenly removed while output power is still being produced. Accordingly, provision is made for the foregoing soft start circuits to act in cooperative combination with other circuit components to implement a controlled shut down of the output. This is also based on the regulation of the internal Vcc supply except that the soft start integrator is reset to its low state very quickly as of any time that the Vcc supply begins to fall out of regulation due to removal of input power. Advantage is also taken of such action through provision of an "under voltage lockout" {if the input mains voltage should fall to a reduced level without being turned completely off, such that proper operation of the power module is in jeopardy.

4. Current Mode means "action of an array of components according to which flow of current in the output power switching stage is continuously monitored as a voltage developed across a resistor, with such developed voltage being fed back to a control integrated circuit where it becomes one of the control inputs to control the system."

Figure 1B:
FIG. 1B is a square wave waveform illustrating waves produced by predetermined operation of switches of FIG. 1A.
Figure 1C:
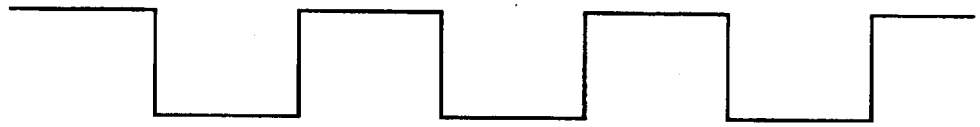
FIG. 1C is a square wave waveform illustrating waves produced by predetermined operation of others of the switches of FIG. 1A.
Figure 1D:
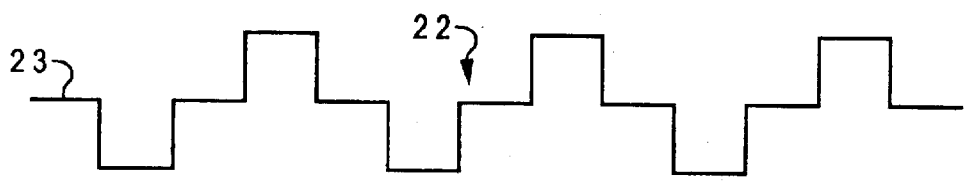
FIG. 1D is a waveform illustrating the effective difference between the waveforms of FIG. 1B

As described below, in the instant circuits, another control input is the value of the final output of the converter which is then compared by a differential amplifier to a fixed reference voltage that is generated by a control integrated circuit. The output of the differential amplifier then becomes one input to a comparitor to which the other input is the current sensing voltage. The overall output control function is achieved when the peak current value that is sensed is used to determine when the power switching device should be turned off. Now turning to the drawing, and more particularly FIG. 1A thereof, it will be seen to be a simplified schematic presented to illustrate the principles underlying the 50% duty cycle character of the system. To facilitate an understanding of the circuit operation, it may be considered that switches 11 and 12 operate in opposition, i.e., when 11 is open, 12 is closed and vice versa. Similarly, when switch 13 is open, 14 is closed and vice versa. In both instances, for each pair there is a provision that in each pair the closing of either switch is slightly delayed relative to the opening of the other so as to ensure that there cannot be simultaneous conduction through both switches of a pair. FIG. 1B represents the voltage at the junction, or output, 15 between switches 11 and 12; while FIG. 1C represents the voltage at the 3unction, or output, 16 between switches 13 and 14. The waveforms of FIG. 1D represent the arithmetic sum of the waveforms of FIGS. 1B and 1C and thus also represents the voltage appearing across the load which is represented by inductor symbol 17. Capacitors 18 and 19 are seen to absorb and deliver current/voltage and are presented to represent in a very general way, snubbing circuits which are described below.

It will now be seen that the waveform 22 of FIG. 1D (the arithmetic sum of waveforms 20 and 21 of FIGS. 1B and 1C) changes in accordance with the relative phases of waves 20 and 21. Thus, if waves 20 and 21 were in phase, the arithmetic sum would be zero and the waveform of FIG. 1D would be a straight line. On the other hand, if waves 20 and 21 were 180 degrees out of phase, the arithmetic sum would be a maximum and the waveform of FIG. 1D would be alternate square waves with no horizontal bridging portion as partially represented by horizontal portion 23. Of course, it will be understood by those skilled in the art that the representations of FIGS. 1A–1D are overly simplified and are presented only to illustrate the principles underlying operation of a phase-controlled 50% duty cycle bridge.

As mentioned above, FIG. 1E is a block diagram depicting inputs, outputs and connections between the circuit blocks that are set forth in FIGS. 2, 3, 4, 5A, 5B, 6, 7 and 8. There are seen conventional alternating current input conductors 30 and 31 which in the above-identified companion applications are referred to as the mains. At the output are direct current output terminals 32/33 and battery module connecting terminals 34/35 which are provided to connect to the battery module also described in the above-identified companion applications.

Figure 1E:
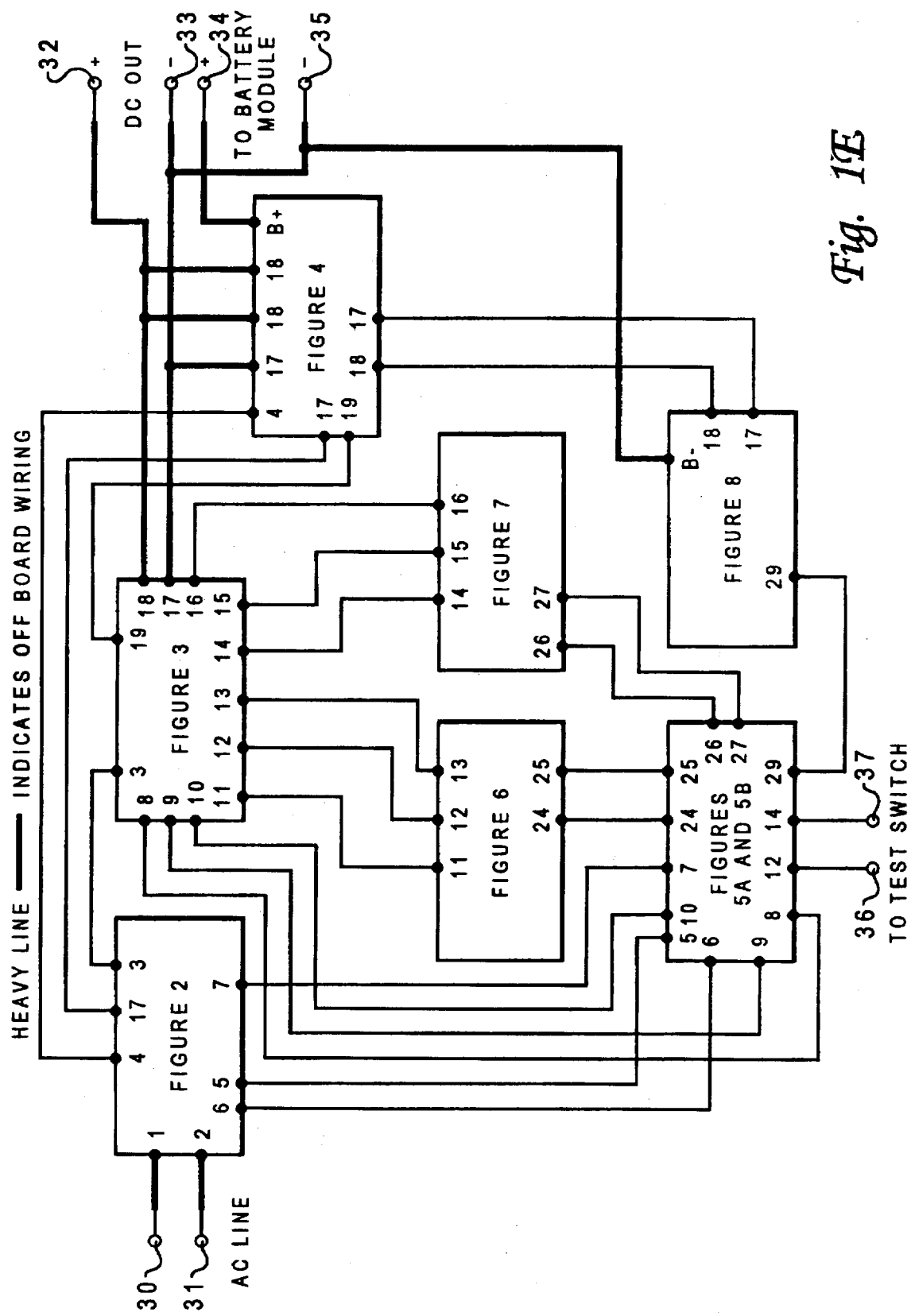
FIG. 1E is a block diagram depicting connections between circuits set forth in FIGS. 2, 3, 4, 5A, 5B, 6, 7 and 8.

Further reference to FIG. 1E reveals the presence of terminals 36 and 37 which are provided for connection to a conventional normally open push button type switch which, upon momentary closure, operates to test the circuits as described in the above-mentioned companion applications.

It will also be observed that certain of the lines in the figures are emphasized by being shown much heavier than the other lines thus (as noted in the caption to FIG. 1E) denoting wiring contemplated as being made off of a conventional circuit board that provides for the remaining connections.

Now turning to FIG. 2, it will be seen that FIG. 2 is a schematic diagram illustrating input circuits and the simplicity of changing of jumpers to correspondingly configure the circuits for different ranges of input voltages. There, incoming mains power enters on line terminals 30 and 31, then passes through a passive capacitor and inductor filter for the suppression of radio frequency interference, consisting of capacitors 50–54 and common mode inductor 55. Initial inrush current at the first application of line voltage is limited by resistor 56 which is in series with the input circuit, and which is shorted by contacts 57a of relay 57 as soon as circuit operation is established.

Following the above there is a second passive line filter, including capacitors 60–63 and inductor 64, which reduces the harmonic content of the current waveform with which the circuit loads the incoming mains. Included in the harmonic filter circuit is a set of terminals with a series of jumpers, J1 through J6, that are mounted on a moveable connecting device which, when attached in either of two possible positions, configures the filter for operation at a higher or lower range of input voltages, and at the same time configures the input rectifier, consisting of rectifier diodes 66–69, to operate as a voltage doubler for the lower input range, or as a bridge rectifier for the higher input voltage range.

Direct current resulting from the operation of the above rectifiers 66–69 is stored by capacitors 70 and 71, and is also supplied to the bridge converter stage (FIG. 3) on line 3 and line C (common). The starting current for the Vcc regulator, to be described, is supplied by resistor 72 (and is carried on line 7), resistor 72 also functioning as the lower of two resistors, the other being 73, which serve to equalize the voltage on the two capacitors 70 and 71. Capacitors 70 and 71 are electrolytic types having some internal leakage current, with leakage current possibly being of differing magnitudes in different units, that could cause unequal sharing of voltage between the two capacitors unless equalizing provision is applied (as represented by resistors 72 and 73).

In further description of the circuits of FIG. 2, the aforementioned harmonic filter may be seen as a parallel tuned trap consisting of inductor 64 and capacitors 60–61 that is connected in series with the incoming line, and shunt capacitors 62/63 across the output of the filter feeding into the rectifier diodes 66–69. Inductor 64 has two equal windings, 64a and 64b, which may be connected in series or in parallel with each other to obtain two values of inductance in the ratio of four to one. The capacitors 61/62 are also arranged to be connected in series or in parallel, again to obtain values in the ratio of four to one. Jumpers J1 through J6 are all preferably carried together on a single connecting device that can be inserted in either of two positions, which has the effect of connecting all of the appropriate parts in series or parallel.

It will also be seen that capacitors 60 and 61 are permanently connected to the windings 64a and 64b of inductor 64 which causes the series and parallel connection of the capacitors and of the windings of the inductor to be accomplished with the same set of connections. By the foregoing changeable sets of values, the filter is configured to operate for higher (series) or lower (parallel) input voltages, with corresponding lower or higher input currents.

There are also two of the jumpers J5 and J6 which at the same time, when the aforementioned jumper carrier is moved, connect the input rectifier consisting of diodes 66–69 for voltage doubler operation when the filter components are connected in parallel for lower input voltage operation, and connect the rectifying diodes 66–69 for bridge operation when the filter components are connected in series for higher input voltage operation. Thus, essentially equivalent operation is obtained for higher or lower input line voltage ranges, in the voltage ratio of two to one.

Figure 3:
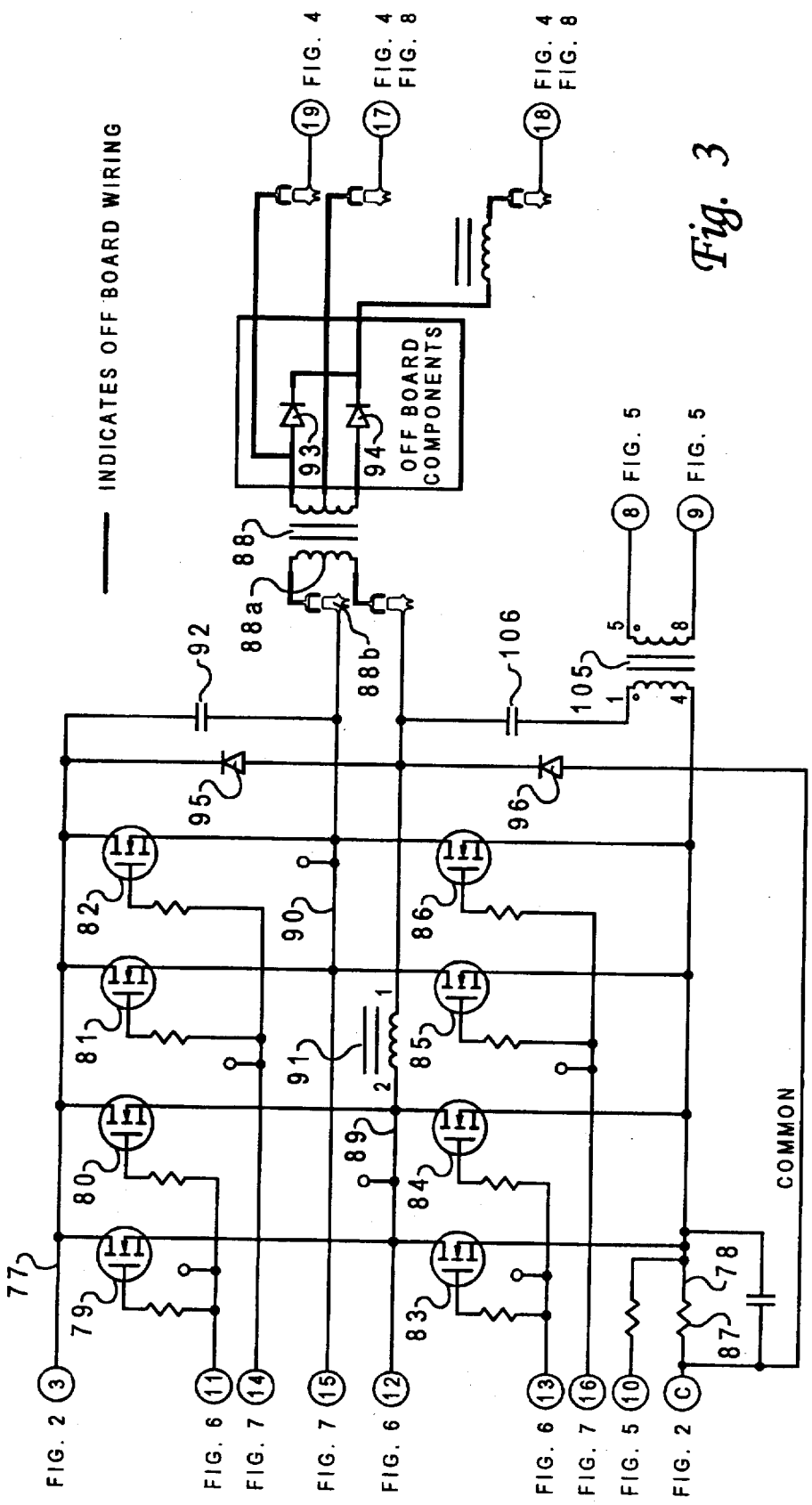
FIG. 3 is a schematic diagram of the preferred bridge converter according to the invention.

Now turning to FIG. 3, there will be seen the bridge converter in accordance with the invention. There, incoming direct current power is received from the circuits of FIG. 2 via terminal 3 and terminal C whence it is conveyed via conductors 77 and 78 to a bridge comprising eight MOSFETS (Metal Oxide Semiconductor Field Effect Transistors) 79–86 arranged in four pairs of parallel connected transistors with the positive voltage on line 77 applied to the drains of the upper pairs and the common line 78 connected as shown through a current sensing resistor 87 to the sources of the lower pairs. Output is obtained from the junctions between the upper and lower pairs, and such junctions are severally communicated to upper and lower terminals of primary winding 88a of output transformer 88 via conductors 89 and 90. Connection is also made (as shown) to current snubbing inductor 91.

The circuits operate by generating drive signals for the switching control of the two sides of the variable output bridge power converter, in which the method of control of the output makes use of the principle of phase shifting the switching of one side of the bridge relative to the switching of the other side, with both sides being continuously driven at a 50 percent duty cycle. This principle is shown and described in connection with FIGS. 1a–1D above and need not be repeated here.

Practical advantages of this configuration over a conventional duty cycle modulated bridge are: (1) the uniform 50 percent drive which makes possible a highly effective MOSFET gate driver design, achieving fast rise and fall of the Gate signals along with a uniform time delay in the turn on of each MOSFET. The advantage is especially apparent when drive transformers are used to couple signals for the upper switching devices, since the average voltage on any transformer winding must be zero, which causes the amplitude and symmetry of secondary voltage to become a function of duty cycle, where duty cycle is required to be variable; (2) the fact that there is no time when the load is open circuited and free to ring at its natural resonant frequency; and (3) the fact that one side of the bridge is always turning the load on while the other side is always turning it off. The latter operates in cooperative combination with the snubbing circuits hereof to achieve significant advantages as mentioned above.

The principal snubbing components are capacitor 92 and snubbing inductor 91. Inductor 91 slows the rate of increase and reduces the peak value of the primary current at turn on, both of which can be quite high due to the reverse recovery currents in the output diodes 93 and 94. If inductor 91 were not present there would also be high reverse recovery currents in the internal inverse diodes in the MOSFETS. Clamping diodes 95 and 96 are included to constrain peak primary voltage on 88 that would otherwise occur and could cause an increase in the peak inverse voltage applied to the main output diodes 93 and 94.

Clamping diodes 95 and 96 also carry much of the sustained inductive current from the primary of transformer 88 during the off time so that the current in the internal inverse diodes in the power MOSFETS is reduced at the following moment of turn on. Due to the reverse recovery time in diodes 95 and 96, such sustained current could cause additional high peak currents in the opposing MOSFETS at the time of turn on.

Capacitor 92 slows the rate of voltage change at transformer primary terminal 88b. Since this terminal is connected to the side of the bridge that always turns off the load, simple capacitive snubbing is highly effective and is all that is required.

The circuits of FIG. 4 are described below near the end of this specification; and reference is now made to FIG. 5A.

Figure 5A:
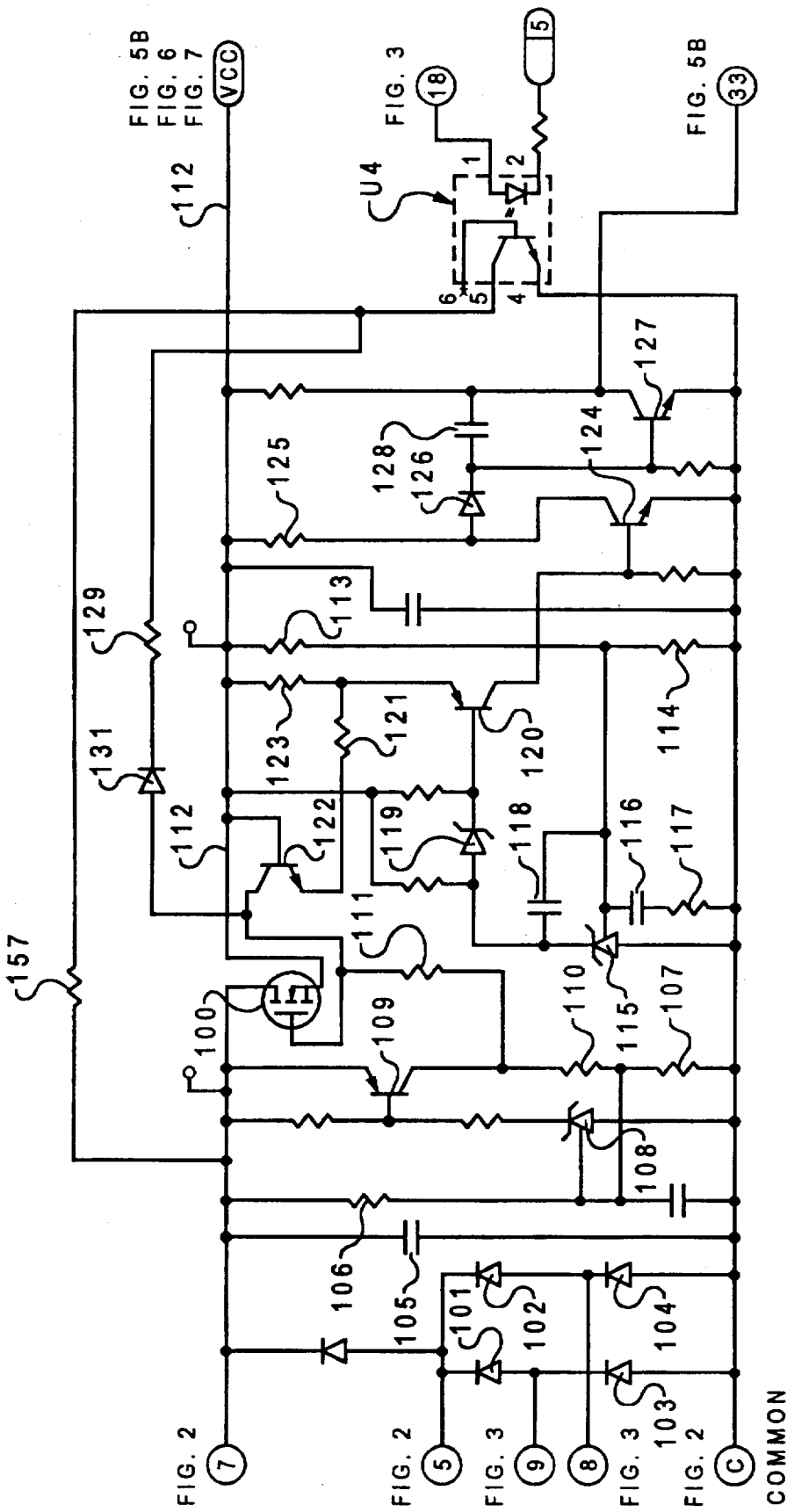
FIG. 5A is a schematic diagram of start up, internal voltage supply regulating, and soft start and shut down control circuits.

The circuits of FIG. 5A provide for the regulation of the Vcc supply for all of the circuits that operate from the Vcc supply. They also provide for start up of the circuits with a small initial current that can be taken from the high input voltage without excessive power loss. Before MOSFET 100 is enabled, the input current to this regulating circuit is small, on the order of one milliampere. When the entire power module is running, the input to the Vcc regulator is supplied by the diode bridge consisting of diodes 101–104 driven from the small transformer 105 (FIG. 3), which in turn receives power from one leg of the output bridge through d-c blocking capacitor 106. In a typical circuit constructed in accordance with the principles hereof, the total current needed to run all the drives was over 100 milliamperes, and would have caused intolerable power loss if it were to be taken directly from the input d-c voltage through a dropping resistor.

Current coming in through resistor 72 (FIG. 2) from the mid point between the two large input capacitors 70 and 71 charges capacitor 105 (FIG. 5A) until the voltage on capacitor 105 is sufficient, after being attenuated by the voltage divider formed by resistors 106 and 107, to turn on reference amplifier 108. The latter (amplifier 108) is a combination reference voltage source and difference amplifier, which begins conduction between what is referred to as the cathode terminals, and what is referred to as the anode terminal, when the voltage on the reference terminal relative to the anode terminal exceeds 2.5 volts. When amplifier 108 begins to conduct, transistor 109 is turned on, sending a positive feedback signal through resistor 110 and back to the reference input of amplifier 108 to lock the circuit on. Another current from transistor 109 passes through resistor 111 to supply gate voltage to MOSFET 100 which is thus enabled to begin delivering the Vcc supply via conductor 112.

Resistors 113 and 114 divide the output voltage of series connected regulator MOSFET 100 to provide an attenuated signal to the reference input of reference amplifier 115. When the divided voltage reaches 2.5 volts, amplifier 115 begins to conduct current through the circuit to be described in the following paragraph, in an amount just sufficient to pull down the gate of MOSFET 100 to the extent required to maintain the output on line 112 at approximately 16 volts. Additional components (capacitor 116 and resistor 117) momentarily shunt resistor 114 to raise the set point of the Vcc regulator to approximately 18 volts for a brief time as the circuit is starting up in order to ensure that the UC3842, reference IC501 (FIG. 5B), will have adequate input voltage to enable its own internal undervoltage lockout circuit. Capacitor 118 modifies the frequency-gain property of amplifier 115 to avoid responding to high frequency signals leaking from the inverter portion of the power module, and also to avoid self oscillation in the Vcc regulator circuit.

As mentioned above, one of the features of the herein disclosed circuits resides in the soft start characteristics that are included to facilitate an orderly and safe start-up. Thus, a soft start circuit is here employed to enhance the reliability of the power module. There is always a risk in inverter circuits of damage to the output power devices at times of power up and power down, since there is usually a time during each of these operations when the supply voltage to some of the internal circuits, especially those involved in pulse generation and the generation of drive voltages to the output devices, will be insufficient for their proper operation. Any disturbance to the normal sequence and/or amplitude of driving signals to the output MOSFET gates could cause times of destructively high power dissipation in the output power switching devices. Accordingly, as hereinafter described, effective soft start and controlled shut-down circuits are employed to safely bring the circuits through start up and shut down.

The cathode current from reference amplifier 115 is required to control the gate voltage of MOSFET 100 in the proper manner to cause the Vcc supply to be maintained at a given voltage. As long as the Vcc supply is within regulation limits, there will be a current existing to the cathode of amplifier 115. However, if for any reason the input voltage to the drain of MOSFET 100 is insufficient to permit the correct regulation of Vcc, amplifier 115 will sense the fall of Vcc and stop conducting cathode current. It is the presence of this current that is used as the signal to the soft start circuit to indicate when normal drive to the output stage can be permitted.

The current for reference amplifier 115 passes through zener diode 119 to the base of transistor 120, causing current to flow to its emitter. That emitter current is then drawn through resistor 121 from the emitter of transistor 122, which in turn draws current via its collector from the gate of MOSFET 100, thus completing the signal path from amplifier 115 to MOSFET 100. Additional current passes through resistor 123 to the emitter of transistor 120 in order that the combined current, which continues on through the collector of transistor 120, is sufficient to drive the base of transistor 124, thus turning on transistor 124 which then absorbs the current from resistor 125 that would otherwise pass through diode 126 to the base of transistor 127. When permitted, the current then serves to keep transistor 127 turned on, thus holding the voltage on the collector of transistor 127 low, which is also the voltage on line 33. When transistor 127 is released it acts as an integrator with capacitor 128 to cause a relatively slow rising soft start signal to be sent out on line 33. Zener diode 119, mentioned above, makes it necessary for a voltage drop to exist across resistor 110 before conduction can begin through zener diode 119. Thus resistor 110 serves to carry the minimum current from reference amplifier 115 that its characteristics require to exist before amplifier 115 will begin proper operation, while preventing the foregoing minimum current, which is not controlled by the amplifier 115 reference terminal voltage, from reaching the base of transistor 120. The foregoing soft start signal is allowed to ramp up from zero beginning at the time that transistor 124 begins to conduct.

A second important action occurs at the time when power is removed from the input of the power module. When the voltage on line 7 falls and it reaches a value where Vcc can no longer be regulated, amplifier 115 is no longer maintained in a conducting state. At this time, the base drive to transistor 124 is also removed, whereupon the current passing through resistor 125 is allowed to reach the base of transistor 127. The collector of transistor 127 then drives line 33 low to effectively turn off the output of the bridge converter. This is required in order to have the output turned off before the Vcc supply falls to a value where operation of the drive circuits is impaired, so as to minimize transients in the output stage during the shut down sequence.

A test signal is supplied to turn off the output of the power module on demand. An optocoupler U4 is used to transfer the signal to the circuits of FIG. 5A. Current carried by the output of the optocoupler pulls down the voltage on the gate of MOSFET 100, and loads line 7 to prevent voltage from building up on line 7. Resistor 157 connects the circuit to load down line 7, and diode 131 and resistor 129 carry the circuit to pull down the gate of MOSFET 100.

Figure 5B:
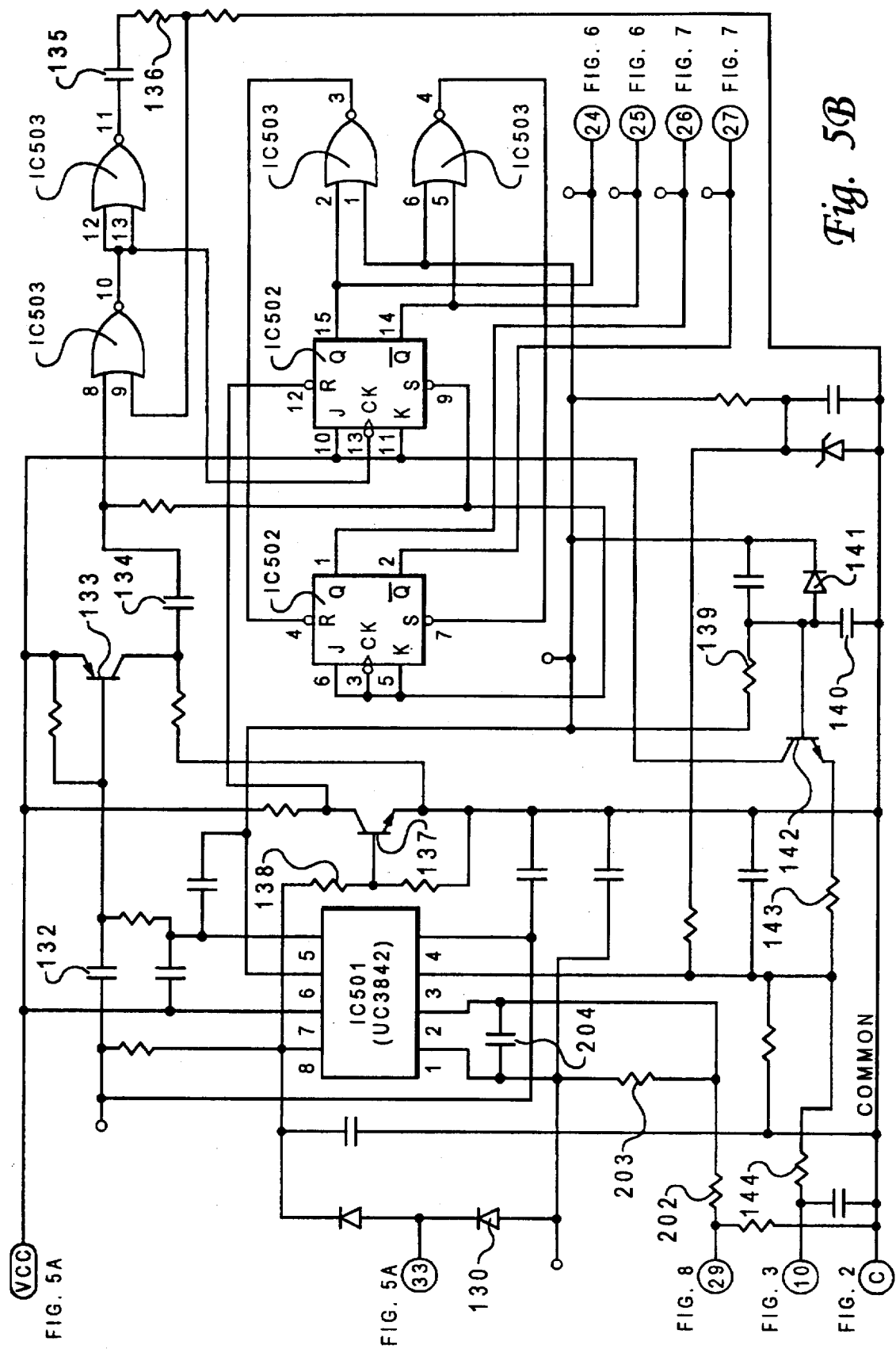
FIG. 5B is a schematic diagram of bridge drive pulse generating circuits.

The point of application of the soft start signal can be seen in FIG. 5B, where the signal on line 33 acts through diode 130 to pull pin 1 of IC501 low. This effectively shuts down the output of IC501. With no output signal on pin 6 of IC501, the phase control pulse generator circuit produces pulses to both legs of the bridge that are in phase and literally identical, so that even though some of the gate drive pulses may be improperly formed during the time when Vcc is insufficient, no damage will result. Pulse generation is described in greater detail in the following description.

FIG. 5B discloses circuits for the bridge drive signal generator. There are seen IC501 which is one of the UC3842 family of power supply control integrated circuits in which an output appearing at pin 6 is periodically driven high to the level of Vcc for a period of time that is variable from zero to a maximum that is slightly shorter than the interval between clock pulses. The clock pulse is generated by an oscillator which produces a sawtooth at pin 4 that ramps up to about 3 volts and quickly returns to 1 volt. Relative timing of clock to output is such that the output on pin 6 goes high about one half microsecond after the sawtooth on pin 4 goes low. The remaining signals are related to closed loop operation and will be considered below. For any additional information, reference is hereby made to the manufacturers data for the type UC3842.

IC502 is a dual JK flip flop CMOS type CD4027, with set, reset, J, K, and clock inputs. The IC503 is a quad 2 input NOR gate CMOS type CD4001. The outputs of flip flop 1 (the flip-flop with output on pins 14 and 15) control the state of one side of the bridge while the outputs of flip flop 2 (outputs on pins 1 and 2) control the other side of the bridge. When the states of both flip-flops are the same, the effective output to the load is zero, since the output appears as the difference between the outputs of the two sides of the bridge, which are then at the same potential.

Circuit operation begins by toggling flip-flop 1 with a delayed clock pulse derived from the sawtooth at pin 4 of IC501. The negative going fast reset of the pin 4 sawtooth is coupled by capacitor 132 to the base of PNP transistor 133 which in turn produces a fast rising positive transition at its collector. From the collector, the signal passes through capacitor 134 to input pin 8 of gate 1 (the gate with output on pin 10) of IC503, and in so doing the positive transition is again differentiated to obtain a still shorter positive pulse.

For the purpose of this description, the four gates of IC503 will be numbered 1 through 4, gate 1 having output on pin 10, gate 2 on pin 11, gate 3 on pin 3, and gate 4 on pin 4. When the pulse arrives at one of the two inputs of IC503 gate 1, it causes the output of that gate to go low, with the further result that the output of gate 2 goes high, since the output of gate 1 is directly connected to both inputs of gate 2. The output of gate 2 is coupled back to the remaining input of gate 1 through capacitor 135 and resistor 136 and the two gates then operate as a monostable or one shot multi-vibrator with an output pulse width of approximately one microsecond. The one shot action has the effect of holding the output of gate 1 low for the one microsecond period, following which the output again goes high and drives the clock input of IC502 on pin 13, which, being a positive edge trigger input, responds only to positive going transitions. There then occurs a change of state of the flip flop whose input is at pin 13, and which for purposes of this description is identified as flip flop 1. Flip flop 1 has its J and K inputs held high and its R and S inputs normally held low, and in this configuration functions as a toggle flip flop. The circuit including transistor 137 that is connected to the flip flop 1 reset at pin 12 serves to initialize the circuit to the required state during power up.

When Vcc first begins to appear, transistor 137 is not conducting, and Vcc is allowed to reach the reset pin of flip flop 1 to determine that the initial state of flip flop 1 will be with the Q output low. When IC501 becomes active, the reference output on pin 8 rises to 5 volts from zero, and current passes through resistor 138 to the base of transistor 137, which then pulls the reset pin of flip flop 1 low to enable toggled operation.

The output on pin 6 of IC501 is connected to one input of each of IC503 gate 3 and gate 4, and has the effect of disabling those gates for the period of time that the IC501 output remains high. The gates are NOR gates in positive logic, but as utilized herein, they function as AND gates in negative logic. The Q1 and Q1 NOT outputs of flip flop 1 are connected to the other inputs of gate 3 and gate 4, so that when the output of IC501 transitions to a low state, whichever gate has its other input low as a result of either Q1 or Q1 NOT being low, will produce a high output level. The high output of gate 3 will reset flip flop 2 while the high output of gate 4 will set flip flop 2. In either case, the effect is to cause flip flop 2 to assume the same state as flip flop 1 as of the time that IC501 output goes low. Thus the effective turn off of the output in this system corresponds to the output turn off command of IC501. The one microsecond delay in the clock signal to flip flop 1 is needed ensure that the output of IC501 will have transitioned high for the beginning of its high period before the change of state of flip flop 1, to ensure that the flip flop 1 transition will not occur before gate 3 and gate 4 are disabled. To do so would defeat the operation of the circuit by causing flip flop 2 to follow the state of flip flop 1 immediately, and would therefore not cause the beginning of the period during which the states of the two flip flops are different.

The output on pin 6 of IC501 is also used to generate a slope compensation signal. When the output goes high, a current passes through resistor 139 and capacitor 140, charging capacitor 140 at a rate such that the charge will continue over the period of time between clock pulses. When the output then goes low, a larger current passes through diode 141 to rapidly discharge capacitor 140. By these actions, a sawtooth waveform is produced at the top of capacitor 140. Such waveform is then buffered by emitter follower 142, to supply a current through resistor 143 to pin 3 of IC501. This signal augments the current feedback signal which comes through resistor 144 from the current sensing resistor 87 (FIG. 3), tending to improve the current sensing signal, and also assists when testing the circuit by making possible the operation of IC501 without any true current sense signal being present, and without having power applied to the output bridge.

As mentioned above, the application of Current Mode Control to a phase controlled bridge is one of the features of the invention. Thus, control of the output power of the converter is accomplished by current mode control. The current flow in the output power switching stage is continuously monitored and each current pulse is terminated as it reaches a given value, that value being a variable which is preset by a circuit within the IC501 that compares the final output of the system with a reference quantity. If the output is below the set point, the current cut-off level is increased in order to produce higher power, and conversely the current cut-off level is decreased if the output is above the set point. The UC3842 integrated circuit, here appearing as IC501, is specifically designed to implement this mode of control. An analog signal related to the 25 final output of the power module is brought to line 29 of FIG. 5B to cause the adjustment of the peak current switch-off point in order to regulate the final output. Such analog signal is provided by circuits of FIG. 8 described below.

Figure 6:
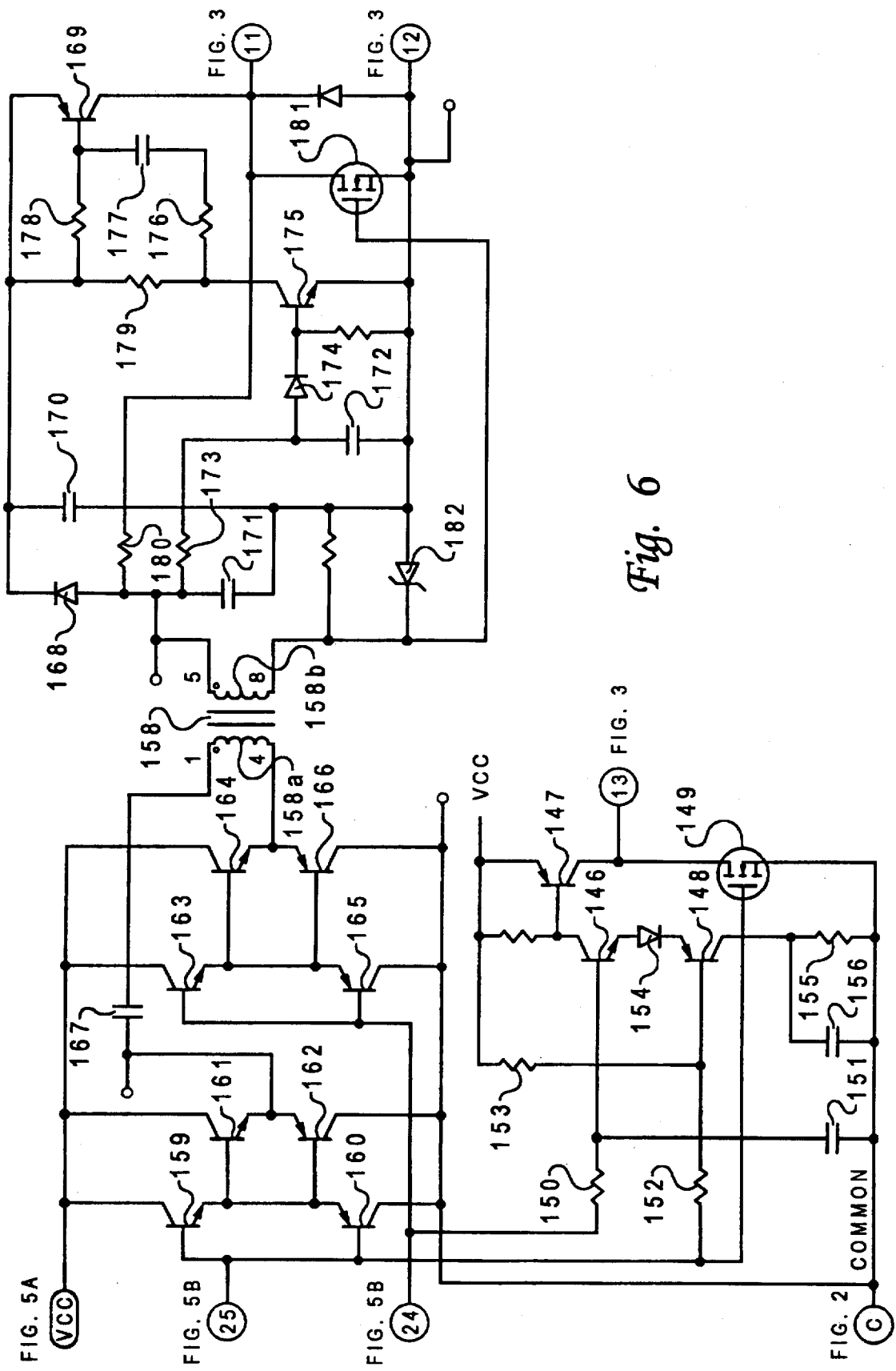
FIG. 6 is a schematic diagram of bridge gate driver circuits.

Reference is now made to FIG. 6 which, as mentioned above, is a schematic diagram of bridge gate driver circuits. There, it will be seen are four MOSFET gate driving circuits, two for the low side, or common referenced MOSFETS, and two for the high side, or positive referenced, MOSFETS. The drives for the high side MOSFETS must be completely isolated from common, since the sources of these MOSFETS are connected to the output. The essential requirements for all of the drivers are to drive the gate capacitances with very short rise times, and especially important, with very short fall times. A second requirement is that there be a delay before the beginning of each rise time, when the MOSFET is being turned on, but that the turn off be done with a very short delay, so that the upper and lower transistors of each side of the bridge will not both be conducting at any time during the transition. If both should conduct, there is essentially no current limit, since the upper and lower MOSFETS are in series directly across the direct current supply bus.

Figure 7:
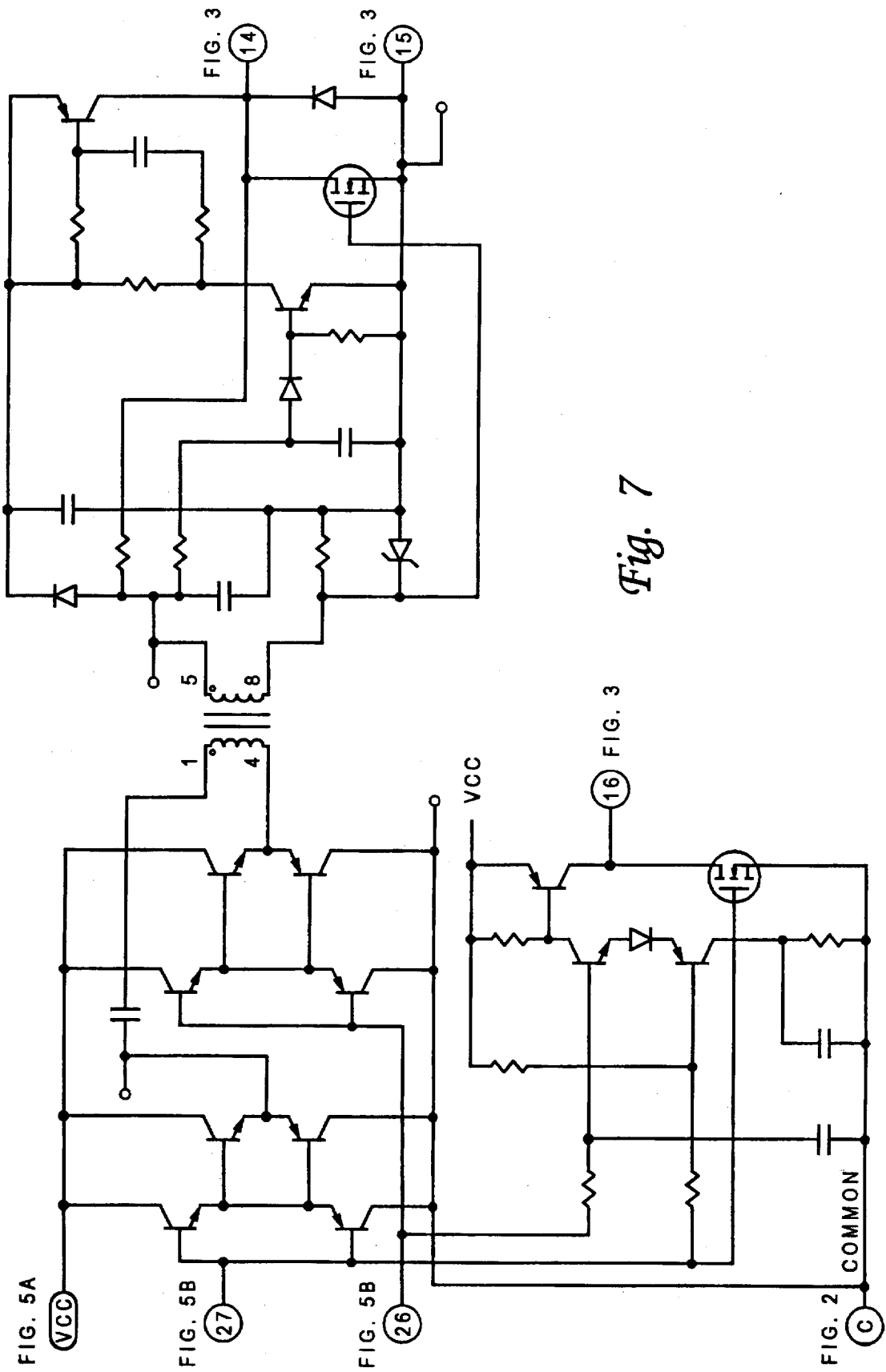
FIG. 7 is a schematic diagram of other bridge gate driver circuits.
Figure 8:
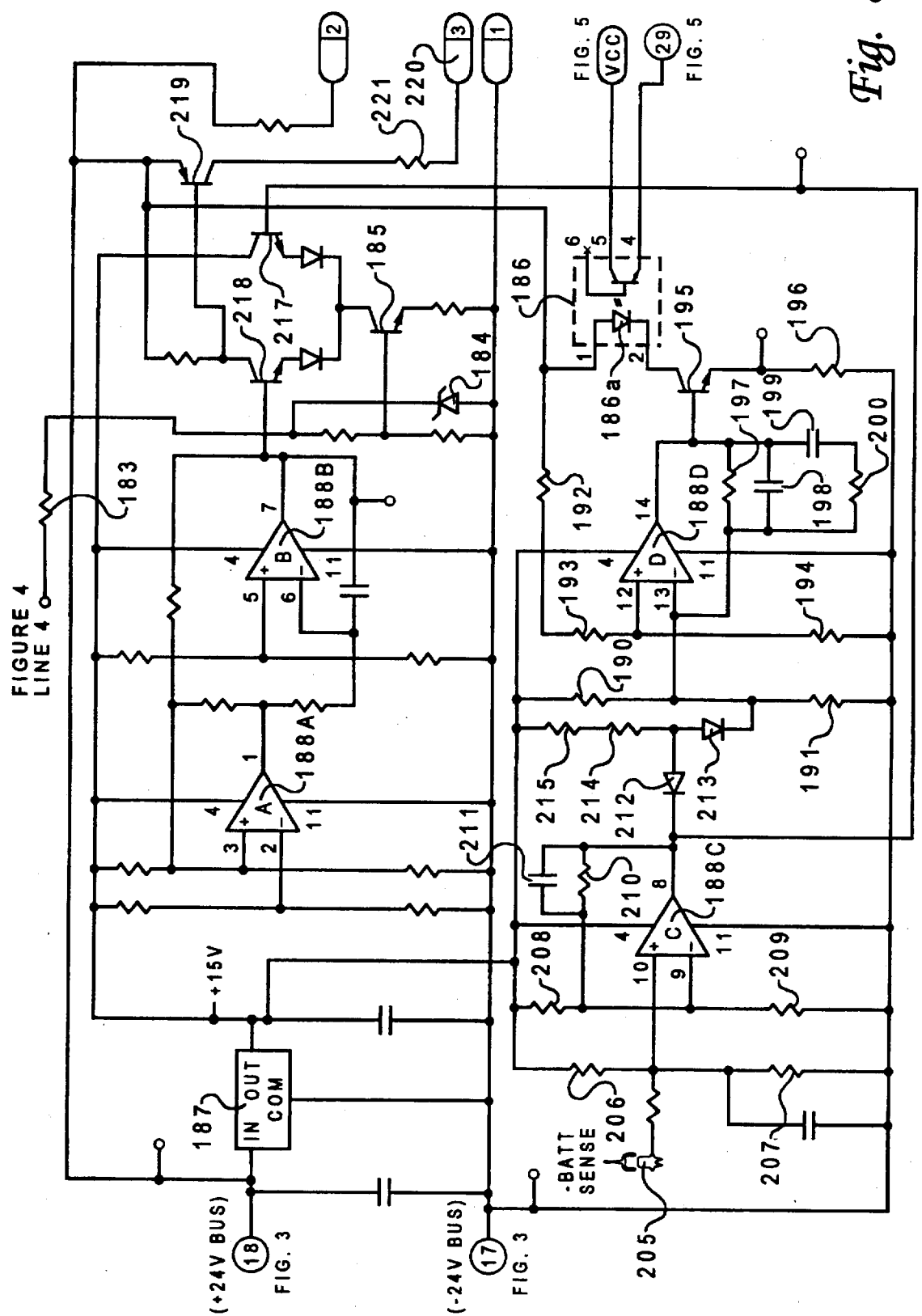
FIG. 8 is a schematic diagram of the output and output voltage feedback control circuits.

At this point it should be noted that the description of the low side drivers of FIG. 6 is applicable also to the drivers of FIG. 7 and therefore to avoid redundancy is not repeated. The circuits including transistors 146 through 149 drive the low side, or grounded source, power MOSFET Gates 83 and 84 (FIG. 3) connected to line 13. These circuits receive drive signals from the Q and Q NOT outputs of the J-K flip-flop 1 on lines 24 and 25 which have the property that when either one is positive, the other is near zero. The signal on line 24 acts through resistor 150 to charge capacitor 151 with a short time delay. If line 24 has just gone high, then at the same time, line 25 goes low, and this drives the voltage divider of resistors 152 and 153 to set the level at the base of transistor 148 to about half the supply voltage. When the voltage on capacitor 151, which had been low and is charging positively, reaches the transistor 148 base voltage plus 2 emitter-base diode drops plus one diode drop, transistor 146 begins to conduct, drawing current through diode 154 and transistor 148. The charging time of capacitor 151 provides the required turn on delay, as previously explained. Transistor 148 has a collector load of resistor 155 and capacitor 156 which provides a higher current initially to give transistor 147 the overdrive needed to quickly charge the gate connected to line 13, but allows the base current of transistor 147 to fall to a low value before the time of the next transition, so that the stored charge in transistor 147 is low and the current to the drain of MOSFET 149 can easily overcome whatever storage time transistor 147 may exhibit.

At the time of the aforementioned next transition, when line 25 goes high and line 24 goes low, transistor 149 serves to quickly discharge the gate on line 13, And at the same time, the base of transistor 148 is driven nearly to Vcc, effectively cutting off the remaining small drive to transistor 147 without waiting for capacitor 151 to discharge. Thus the MOSFET gate connected to line 13 is quickly brought to a low level, without time delay.

Lines 24 and 25 also feed signals to the bases of transistors which in turn drive the primary 158a of the high side drive isolation transformer 158. Line 25 feeds the bases of transistor 159 and 160, which act as a complementary emitter follower to drive the bases of transistors 161 and 162, also a complementary emitted follower, thus creating a combination which might be described as a complementary darlington emitter follower. The other group including transistors 163–166 is similar. Each group drives one end of the primary 158a of transformer 158, in opposite phase, with the direct current component.

For the purposes of the high side driver discussion, potentials are described as being referenced to the driver output return, line terminal 12 in the case of FIG. 6, keeping in mind that the output return line is itself operating at high potential with respect to the common of the other parts of the circuit. Secondary voltage from the secondary winding 158b of drive transformer 158 is applied to the input of the high side drive shaping circuits which are in the right hand side of FIG. 6. This voltage has equal values in the positive and negative directions.

When pin 5 of transformer secondary winding 158b is negative, diode 168 prevents the negative voltage from reaching transistor 169, and allows positive charge to remain on capacitor 170. Capacitor 171 becomes negatively charged, as does capacitor 172 through resistor 173. Diode 174 blocks the negative voltage on capacitor 172 from reaching the base of transistor 175 in order to not exceed the reverse emitter base limit of that transistor, which would cause clamping of the negative voltage to a reduced value. When pin 5 of transformer winding 158b swings positive, capacitor 172 begins to be charged positive from the negative level by a current through resistor 173, and when it reaches a small positive level, current flows through diode 174 to drive the base of transistor 175. The time for charging capacitor 172 provides the required turn-on delay. Collector current of transistor 175 then drives the base of transistor 169 through resistor 176 and capacitor 177 in series. After a short time, drive to the base of transistor 169 is terminated by the action of resistor 178 and capacitor 177. It should be noted that at the following negative signal transition, when transistor 175 is no longer conducting, capacitor 177 is discharged by resistors 179 and 176 in series, in order to be preset for the next positive transition. The coupling method just described results in a short pulse of drive to the base of transistor 169 with a peak current sufficient to drive transistor 169 to cause a rapid charge of the gate capacitance of the output MOSFET 181 connected to line 11, without causing a sustained base current. The base current is intentionally confined to the short time needed to charge the gate, so that sufficient time is allowed for transistor 169 to turn off before the next negative swing at pin 5 of transformer secondary 158b. The sustaining voltage for line 11 during the time between transitions is provided by resistor 180 which is directly connected from pin 5 of transformer winding 158b to line 11. As the gate of MOSFET 181 requires no sustained drive current, the small current passed by resistor 180 is sufficient to maintain gate voltage during the conduction time.

When pin 5 of transformer winding 158b again goes negative, the return current to pin 8 drives the gate of MOSFET 181 positive to a value limited by zener 182. MOSFET 181 then serves to quickly remove the positive charge of the gate on line 11. The speed of this action is augmented by the charging current of capacitor 171. As in the case when pin 5 of transformer winding 158b is positive, sustaining voltage is carried by resistor 180. Transistor 181 is also maintained in conduction to assist in holding line 11 low, during the switching time when there is a possibility of stray capacitive coupling to the gate and traces of line 11 causing undesired signals to occur as the entire drive circuit rapidly transitions from common potential to the positive DC potential present on line 3. As mentioned above, capacitor 177 is then discharged by resisters 179 and 176 in series in order to be reset for the next positive drive time.

As mentioned above, FIG. 8 is a schematic diagram of the output and pulse feedback control circuits according to the invention. Sensing of output voltage and current is performed by the circuits. The circuits, which are connected to the main 24 volt output of the power module, perform sensing and indicating operations, and transfer an analog control signal across the isolation barrier between input and output by means of opto-coupler 186. A local supply voltage is produced by 3 terminal integrated circuit voltage regulator 187 which supplies 15 volts d-c and is powered by the 24 volt bus (Line terminal 18). A quad operational amplifier 188 which preferably is an LM 324 or equivalent type, performs the error amplifications function for output voltage, and senses battery charging current so as to be able to program the battery maintaining voltage from Cyclic Charge Level to Float Charge Level (as described below), when battery charging current has fallen to a low value, and also controls a visible light emitting diode (LED) that indicates visually the state of charge of the battery.

To facilitate description, the four amplifiers contained in Quad Operation Amplifier 188 will be designated A, B, C, and D, with A having output on pin 1, B on pin 7, C on pin 8, and D on pin 14. Amplifier 188D has a divided fraction of the 15 volt supply applied to its inverting input, pin 13, with division performed by resistors 190 and 191. A similarly divided fraction of the 24 volt output is applied to the non-inverting input, pin 12, with division by resistors 192, 193 and 194. If the 24 volt related input is greater than the 15 volt related input, the output of the amplifier on pin 14 is driven positive, in turn driving the base of transistor 195 positive. This causes increasing current to flow through resistor 196, and a nearly identical current to flow through the light emitting diode portion 186a of the opto-coupler 186. Thus, a current that is linearly related to the output voltage of amplifier 188D is supplied to the opto-coupler. Feedback components resistor 197, capacitor 198, capacitor 199, and resistor 200 modify the gain-phase properties of amplifier 188D to obtain improved dynamic response in the overall control loop.

The output of the opto-coupler is conducted to FIG. 5B via line 29. It conducts a variable current from the Vcc supply to resistor 202 (FIG. 5B) to the input of the error amplifier contained within IC501, thus closing the control loop. Increasing current from the opto-coupler output drives the input to resistor 202 positive, which causes the output on pin 1 of the IC501 error amplifier, of which pin 2 is the inverting input, to become less positive, and as a result, causes each output current pulse to be terminated at a lower level, thus correcting the output level to the preset value. Additional feedback components resistor 203 and capacitor 204 are employed to permit additional phase-gain correction for the control loop.

The specific output voltage level to which the output is regulated will have two discreet values, depending on the state of charge of the battery. One level, referred to as the *Cyclic Recharge Voltage Level*, is the higher of the two, and is used to replace charge in the battery following a period of discharge. The other, referred to as the *Float Charge Voltage Level*, is a lower level that is used to maintain the charged condition of the battery after a fully charged state has been reached. The circuits determine which level is appropriate at any given time, and the method here used to make that determination is by measuring the charging current that is flowing to the battery. In accordance with the preferred embodiment, batteries of the type herein used have the property, when being charged under constant voltage conditions, of absorbing a charging current which is relatively high initially and which diminishes as the state of charge increases, until at full charge only a small current is accepted.

In the preferred circuits, the measurement of battery charge current is accomplished by measuring the voltage drop in the resistance of the wire connecting the negative output of the converter to the negative terminal of the battery. A wire, separate from the one carrying the charging current, is connected to the negative battery terminal and is returned to the non-inverting input pin 10 of operational amplifier 188C via terminal 205. This, in combination with biasing resistors 206, 207, 208, and 209, and also feedback resistor 210 and capacitor 211, causes the amplifier 188C to generate at its output terminal 8, a voltage proportional to the battery charging current, with a voltage level sufficient to activate the following circuits.

A reference voltage for operational amplifier 188D is created by the voltage divider consisting of resistors 190 and 191, such voltage being approximately 4 volts. The output of amplifier 188C is carried by diode 212 to the anode of diode 213, which in turn carries a small current, which is provided by resistors 214 and 215, into the junction of resistors 190 and 191, slightly raising the reference voltage at that junction as long as the output of amplifier 188C is higher than 4 volts. If the output of amplifier 188C is lower than 4 volts, the current from resistor 214 is diverted through diode 212, and the voltage at the junction of resistors 190 and 191 is not raised. Since the reference voltage determines the value to which the system output voltage is regulated, modifying the reference voltage as described above effectively changes the output voltage regulating point. The values of the various resistors in the network are chosen so that the increase of reference voltage is correct to cause the output voltage to be increased from the specified Float Charge Voltage Level to the specified Cyclic Recharge Voltage Level, whenever the battery charging current is greater than the value for which the circuit is calibrated.

Provision is made for a State of Charge Indicator. The output of amplifier 188C is also conducted to the base of transistor 217 which is one side of a differential amplifier pair also including transistor 218. The base of transistor 218 is supplied with a low frequency triangular wave form by the oscillator circuit including amplifiers 188A and 188B and associated components. As the output of amplifier 188C varies with the amount of battery charging current, the bias voltage to the base of transistor 217 is varied, and the point of the aforesaid triangular waveform where conduction transfers from transistor 218 to transistor 217 likewise varies, with the result that the portion of the time of each oscillator cycle during which transistor 218 conducts is varied. The conduction of transistor 218 is applied to the base of transistor 219 causing the latter to conduct collector current which drives a visible light emitting diode (LED), which is external to the circuit board and is connected to terminal 220 through resistor 221, to indicate, by flashing at a constant rate but with variable duty cycle, the state of charge of the battery. The triangular waveform mentioned above has a minimum value at the negative peak of approximately 4 volts so that the transition to 100 percent duty cycle of the visible LED will correspond to the transition of the voltage regulating function from cyclic to float level.

In order to disable the indicating LED when the power module is not powered from the mains, the voltage on line 4 in FIG. 4, which is developed at the top of capacitor 251, and which is only present when the unit is powered by the mains, is also used to enable the operation of the state of charge light. Since the full on state of the light indicates full charge because the charging current is then low, an unpowered module would give the same indication. The voltage on line 4 feeds current through resistor 183 to power zener 184 and supply the base voltage for the current sinking transistor 185. When transistor 185 is not conducting, the drive to transistor 219 will not occur, and the LED indication is prevented.

Reference is now made to FIG. 4 which is a schematic diagram of battery low voltage cut-off circuits. Due to the tendency of the preferred type of battery to be damaged if it is discharged too deeply, a discharge limiting circuit is included to disconnect the battery when the terminal voltage of the battery falls to a minimum allowable value.

Battery terminal voltage is supplied to the circuits of FIG. 4 on line terminal 18 (positive) and line terminal 17 (negative). That voltage is divided by resistors 240, 241, and 242, with a ratio such that the voltage at the junction of resistors 241 and 242 reaches 2.5 volts when the battery voltage is at the desired minimum value. For all values above this, the reference amplifier 243 will be maintained in a conducting mode, and such conduction after passing through resistor 244 also serves to drive the base of transistor 245, which in turn drives the coil 246a of the battery relay 246. In addition, a small current flows through resistor 247 back to the reference terminal of zener 243 to act as a positive feedback to provide a limited degree of latching action. When the battery voltage falls below the above mentioned value, the conduction of zener 243 and transistor 245 stops, and the relay is released.

An auxiliary circuit consisting of resistors 246, diode 249, resistor 250, capacitor 251, diode 252, and resistor 253 receives energy from the secondary of the main output transformer 88 (FIG. 3), and supplies a second signal to the reference terminal of zener 243. This signal serves to cause the relay to be energized even when the battery voltage is below minimum as long as the converter is operating, so that charge will be applied to the battery in the case where battery voltage is too low to operate the circuit directly. Without this provision, a deeply discharged battery might not receive charge even though the converter was operating on line power.

It will now be evident that there has been described herein, an improved phase controlled 50 percent duty cycle bridge that operates in a current mode and in cooperation and combination with improved snubbing, soft start-up, controlled shut-down, voltage control, battery charging and related circuits to ameliorate untoward effects otherwise associated with start-up, shut-down, circuit switching, battery charging and other dynamic circuit operations.

Although the inventions hereof have been described by way of a preferred embodiment, it will be evident that other adaptations and modifications may be employed without departing from the spirit and scope thereof. For example, different types of batteries could be employed having different charge/discharge characteristics.

The terms and expressions employed herein have been used as terms of description and not of limitation; and thus, there is no intent of excluding equivalents, but on the contrary it is intended to cover any and all equivalents that may be employed without departing from the spirit and scope of the invention.

What is claimed is:

1. A phase controlled constant duty cycle bridge comprising:
   (a) pairs of switching elements severally conducting during alternate half waves to produce two essentially fifty percent duty cycle substantially square wave signals, said switching elements normally having first load-line voltage-current load characteristics;
   (b) means including phase shifting circuits interconnected with said switching elements for controlling phase relationships between said two substantially square wave signals; and
   (c) circuit conditioning means including snubbing circuits interconnected with said switching elements for modifying said first load-line characteristics at moments of switch-on of said switching elements to reduce voltage and current through said switching elements.

2. A phase controlled constant duty cycle bridge according to claim 1 in which said circuit conditioning means includes means for minimizing voltage and current through said switching elements at said moments of switch-on.

3. A phase controlled constant duty cycle bridge according to claim 1 further including, in combination, means for effecting soft start-up.

4. A phase controlled constant duty cycle bridge according to claim 1 further including, in combination, means for effecting controlled shut-down.

5. A phase controlled constant duty cycle bridge according to claim 1 further including, in combination, means for affecting soft start-up and means for affecting controlled shut-down.

6. A phase controlled constant duty cycle bridge according to claim 1 in which said circuit conditioning means further includes circuits for modifying said normal load-line characteristics at moments of switch off of said switching elements to minimize voltage and current through said switching elements.

7. A phase controlled constant duty cycle bridge according to claim 6 further including, in combination, means for effecting soft start-up.

8. A phase controlled constant duty cycle bridge according to claim 6 further including, in combination, means for affecting controlled shut-down.

9. A phase controlled constant duty cycle bridge according to claim 6 further including, in combination, means for affecting soft start-up and means for effecting controlled shut-down.

10. A phase controlled constant duty cycle bridge according to claim 6 wherein said two essentially fifty percent duty cycle substantially square wave signals are of opposite polarity.

11. A phase controlled constant duty cycle bridge according to claim 6 wherein said means for controlling phase relationships includes means for controllably changing said phase relationships between about 0 and about 180 degrees.

12. A phase controlled constant duty cycle bridge according to claim 6 further including a battery, battery charging means for charging said battery according to a cyclic recharging mode or to a float charging mode, means for identifying a cyclic recharge battery voltage level and a float charge battery voltage level, and means responsive to battery voltage levels for conditioning said battery charging means to said cyclic recharging mode when voltage level of said battery is at said cyclic recharge battery voltage level and for conditioning said battery charging means to said float charging mode when said voltage level of said battery is at said float charge voltage level.

13. A phase controlled constant duty cycle bridge according to claim 6 further including circuits interconnected with said switching elements to operate said switching elements by current mode control.

14. A phase controlled constant duty cycle bridge according to claim 13 wherein said two essentially fifty percent duty cycle substantially square wave signals are of opposite polarity.

15. A phase controlled constant duty cycle bridge according to claim 13 wherein said means for controlling phase relationships includes means for controllably changing said phase relationships between about 0 and about 180 degrees.

16. A phase controlled constant duty cycle bridge according to claim 13 further including circuits interconnected with said switching elements to operate said switching elements by current mode control.

17. A phase controlled constant duty cycle bridge according to claim 13 further including, in combination, means for effecting soft start-up.

18. A phase controlled constant duty cycle bridge according to claim 13 further including, in combination, means for affecting controlled shut-down.

19. A phase controlled constant duty cycle bridge according to claim 13 further including, in combination, means for affecting soft start-up and means for effecting controlled shut-down.

20. A phase controlled constant duty cycle bridge according to claim 13 wherein said switching elements comprise two pairs of metal oxide semiconductor field effect transistors (MOSFETS), one of said pairs for driving a high side of said bridge and the other of said pairs for driving a low side of said bridge, said bridge further including switching means for driving said pairs of MOSFETS to prevent MOSFETS of said high side and said low side from being on together at any time during operation of said bridge.

21. A phase controlled constant duty cycle bridge according to claim 20 wherein said phase shifting circuits include a first flip-flop circuit and a second flip-flop circuit and wherein when said first and said second flip-flop circuits are in an identical condition, output of said bridge is essentially zero.

22. A phase controlled constant duty cycle bridge according to claim 21 including means for changing relative phase relationship between said flip-flops and wherein said output of said bridge corresponds to said relative phase relationship.

23. A phase controlled constant duty cycle bridge according to claim 22 further including means interconnecting said phase shifting circuits with said two pairs of MOSFETS to drive said pairs of MOSFETS with fast voltage transitions and controlled time delays.

24. A phase controlled constant duty cycle bridge according to claim 1 wherein said two essentially fifty percent duty cycle substantially square wave signals are of opposite polarity.

25. A phase controlled constant duty cycle bridge according to claim 1 wherein said means for controlling phase relationships includes means for controllably changing said phase relationships between about 0 and about 180 degrees.

26. A phase controlled constant duty cycle bridge according to claim 1 wherein said switching elements comprise two pairs of metal oxide semiconductor field effect transistors (MOSFETS), one of said pairs for driving a high side of said bridge and the other of said pairs for driving a low side of said bridge, said bridge further including switching means for driving said pairs of MOSFETS to prevent MOSFETS of said high side and said low side from being on together at any time during operation of said bridge.

27. A phase controlled constant duty cycle bridge according to claim 1 further including a battery, battery charging means for charging said battery according to a cyclic recharging mode or to a float charging mode, means for identifying a cyclic recharge battery voltage level and a float charge battery voltage level, and means responsive to battery voltage levels for conditioning said battery charging means to said cyclic recharging mode when voltage level of said battery is at said cyclic recharge battery voltage level and for conditioning said battery charging means to said float charging mode when said voltage level of said battery is at said float charge voltage level.

28. A phase controlled constant duty cycle bridge according to claim 27 further including light emitting diode flashing means for visually indicating state of charge of said battery.

29. A phase controlled constant duty cycle bridge according to claim 1 further including jumper means comprising a set of jumpers mounted on a physical support, and connecting means for receiving said jumpers, said connecting means being effective when said jumpers are connected to said connecting means in one mode for conditioning said bridge to receive alternating current potential at a first voltage level and when in another mode for conditioning said bridge to receive alternating current potential at a second voltage level twice that of said first level.

30. A phase controlled constant duty cycle bridge according to claim 1 further including commercial power means for introducing alternating current power into circuits of said bridge to provide power for operating said bridge and filter means including a pair of input filters interconnected between said commercial power means and said bridge for supressing radio frequency interference and for reducing harmonic content of current waveform with which said bridge circuits load said commercial power.

31. A phase controlled constant duty cycle bridge according to claim 30 in which said input filters are connected in series.

32. A phase controlled constant duty cycle bridge comprising:
    (a) pairs of switching elements severally conducting during alternate half waves to produce two essentially fifty percent duty cycle substantially square wave signals, said switching elements normally having first load-line voltage-current load characteristics;
    (b) means including phase shifting circuits interconnected with said switching elements for controlling phase relationships between said two substantially square wave signals; and
    (c) circuit conditioning means including snubbing circuits interconnected with said switching elements for modifying said first load-line characteristics at moments of switch-off of said switching elements to reduce voltage and current through said switching elements.

33. A phase controlled constant duty cycle bridge according to claim 32 in which said circuit conditioning means includes means for minimizing voltage and current through said switching elements at said moments of switch-off.

34. A phase controlled constant duty cycle bridge according to claim 32 further including, in combination, means for affecting soft start-up.

35. A phase controlled constant duty cycle bridge according to claim 32 further including, in combination, means for affecting controlled shut-down.

36. A phase controlled constant duty cycle bridge according to claim 32 further including, in combination, means for effecting soft start-up and means for affecting controlled shut-down.

37. A phase controlled constant duty cycle bridge according to claim 32 further including circuits interconnected with said switching elements to operate said switching elements by current mode control.

38. A phase controlled constant duty cycle bridge according to claim 37 further including, in combination, means for affecting soft start-up.

39. A phase controlled constant duty cycle bridge according to claim 37 further including, in combination, means for affecting controlled shut-down.

40. A phase controlled constant duty cycle bridge according to claim 37 further including, in combination, means for affecting soft start-up and means for affecting controlled shut-down.

41. A phase controlled constant duty cycle bridge according to claim 32 wherein said two essentially fifty percent duty cycle substantially square wave signals are of opposite polarity.

42. A phase controlled constant duty cycle bridge according to claim 32 wherein said means for controlling phase relationships includes means for controllably changing said phase relationships between about 0 and about 180 degrees.

43. A phase controlled constant duty cycle bridge according to claim 32 further including a battery, battery charging means for charging said battery according to a cyclic recharging mode or to a float charging mode, means for identifying a cyclic recharge battery voltage level and a float charge battery voltage level, and means responsive to battery voltage levels for conditioning said battery charging means to said cyclic recharging mode when voltage level of said battery is at said cyclic recharge battery voltage level and for conditioning said battery charging means to said float charging mode when said voltage level of said battery is at said float charge voltage level.

44. A phase controlled constant duty cycle bridge according to claim 43 further including light emitting diode flashing means for visually indicating state of charge of said battery.

45. A phase controlled constant duty cycle bridge according to claim 32 further including jumper means comprising a set of jumpers mounted on a physical support, and connecting means for receiving said jumpers, said connecting means being effective when said jumpers are connected to said connecting means in one mode for conditioning said bridge to receive alternating current potential at a first voltage level and when in another mode for conditioning said bridge to receive alternating current potential at a second voltage level twice that of said first level.

* * * * *